(12) United States Patent
Dally et al.

(10) Patent No.: US 7,683,680 B2
(45) Date of Patent: *Mar. 23, 2010

(54) COMBINED PHASE COMPARATOR AND CHARGE PUMP CIRCUIT

(75) Inventors: William J. Dally, Stanford, CA (US); Ramin Farjad-Rad, Mountain View, CA (US); Teva J. Stone, San Jose, CA (US); Xiaoying Yu, Milpitas, CA (US); John W. Poulton, Chapel Hill, NC (US)

(73) Assignee: Rambus, Inc., Los Altos, CA (US)

( * ) Notice: Subject to any disclaimer, the term of this patent is extended or adjusted under 35 U.S.C. 154(b) by 474 days.

This patent is subject to a terminal disclaimer.

(21) Appl. No.: 11/217,109

(22) Filed: Aug. 30, 2005

(65) Prior Publication Data

US 2006/0082399 A1    Apr. 20, 2006

Related U.S. Application Data

(63) Continuation of application No. 09/849,920, filed on May 4, 2001, now Pat. No. 6,937,073, which is a continuation of application No. 09/414,761, filed on Oct. 7, 1999, now Pat. No. 6,275,072.

(51) Int. Cl.
  *H03B 19/00*    (2006.01)
(52) U.S. Cl. ............................. 327/116; 327/119; 327/7
(58) Field of Classification Search .................. None
  See application file for complete search history.

(56) References Cited

U.S. PATENT DOCUMENTS

| 3,564,434 A | * | 2/1971 | Grebene et al. ............. 329/326 |
|---|---|---|---|
| 4,626,796 A | | 12/1986 | Elder |
| 5,260,608 A | | 11/1993 | Marbot |
| 5,278,702 A | * | 1/1994 | Wilson et al. ................. 360/51 |
| 5,361,254 A | | 11/1994 | Storck et al. |
| 5,432,481 A | | 7/1995 | Saito |
| 5,514,990 A | | 5/1996 | Mukaine et al. |
| 5,537,069 A | | 7/1996 | Volk |
| 5,592,109 A | * | 1/1997 | Notani et al. .................. 327/3 |
| 5,646,564 A | | 7/1997 | Erickson et al. |
| 5,703,540 A | * | 12/1997 | Gazda et al. .................. 331/16 |

(Continued)

OTHER PUBLICATIONS

Dally, William J. and Poulton, John W., "Digital Systems Engineering," Cambridge University Press, 1998, pp. 428-447, 459-460, 615-620 and 626-627.

(Continued)

*Primary Examiner*—Cassandra Cox
(74) *Attorney, Agent, or Firm*—Hamilton, Brook, Smith & Reynolds, P.C.

(57) ABSTRACT

A phase comparison of timing signals is made by combinational circuitry which receives the timing signals and a window signal, the window signal identifying edges of the timing signals to be compared. The comparison may result in a charge pumped output which can be fed back to control the phase of one of the timing signals. The phase comparator and charge pump circuit can be included in a multiplier circuitry in which the phase of an input signal is directly compared to the phase of an edge of the multiplied signal.

18 Claims, 17 Drawing Sheets

U.S. PATENT DOCUMENTS

| | | |
|---|---|---|
| 5,717,353 A | 2/1998 | Fujimoto |
| 5,786,715 A | 7/1998 | Halepete |
| 6,014,177 A | 1/2000 | Nozawa |
| 6,037,812 A | 3/2000 | Gaudet |
| 6,043,717 A | 3/2000 | Kurd |
| 6,075,406 A | 6/2000 | Lee et al. |
| 6,087,864 A | 7/2000 | Aoki |
| 6,097,777 A | 8/2000 | Tateishi et al. |
| 6,114,915 A | 9/2000 | Huang et al. |
| 6,125,158 A * | 9/2000 | Carson et al. ............... 375/376 |
| 6,208,183 B1 | 3/2001 | Li et al. |
| 6,211,742 B1 | 4/2001 | Tan et al. |
| 6,223,297 B1 * | 4/2001 | Inoue ........................ 713/501 |
| 6,259,755 B1 | 7/2001 | O'Sullivan et al. |
| 6,275,072 B1 | 8/2001 | Dally et al. |
| 6,285,225 B1 | 9/2001 | Chu et al. |
| 6,294,816 B1 * | 9/2001 | Baukus et al. .............. 257/368 |
| 6,430,244 B1 * | 8/2002 | Ryu ........................... 375/376 |
| 2001/0015663 A1 | 8/2001 | Dally et al. |

OTHER PUBLICATIONS

Dally, William J. and Poulton, John W., *Digital Systems Engineering*, Cambridge University Press, 1998, pp. 537-540 and 547-548.

Kim, Weigant and Gray, "PLL/DLL System Noise Analysis for Low Jitter Clock Synthesizer Design," ISCAS, 1994, pp. 31-34.

Waizman, A., "A Delay Line Loop for Frequency Synthesis of De-Skewed Clock," IEEE International Solid-State Circuits Conference, 1994, pp. 298-299.

Dally, William J. and Poulton, John W., "Transmitter Equalization for 4Gb/s Signaling," IEEE Micro, Jan.-Feb. 1997, pp. 48-56.

* cited by examiner

COMBINED PHASE COMPARATOR AND CHARGE PUMP CIRCUIT

RELATED APPLICATIONS

This application is a continuation of application Ser. No. 09/849,920, filed May 4, 2001, issuing on Aug. 30, 2005 as U.S. Pat. No. 6,937,073, which is a continuation of application Ser. No. 09/414,761, filed Oct. 7, 1999, now U.S. Pat. No. 6,275,072. The entire teachings of the above applications are incorporated herein by reference.

BACKGROUND OF THE INVENTION

Timing circuits are used in digital circuits to generate and align clock signals. For example they are used to synthesize clocks at various frequencies in microprocessors and other computer circuits. They are also used to generate and recover bit clocks in data communication circuits. Most of these timing circuits take the form of a phase-locked loop (PLL) or a delay-locked loop (DLL). The design and analysis of these timing circuits is discussed in detail in Dally and Poulton, *Digital Systems Engineering*, Cambridge, 1998, pp. 428-447.

An example DLL is shown in FIG. 2. Input aclk is delayed by five inverters 121-125 generating five equally-spaced clock phases, bclk-fclk. The phase comparator 126 compares phases bclk and fclk and outputs control signals up and down to charge pump 127. The charge pump 127 transfers charge to or from capacitor 128 in response to the control signals to adjust the voltage on inverter supply line 129. By adjusting the inverter supply voltage, the phase comparator and charge pump act to bring bclk and fclk into phase. Once the DLL control loop has converged, bclk and fclk are in phase, and clocks bclk to eclk have equally spaced phases 90-degrees apart (and complemented for the odd phases).

As illustrated in FIG. 3, if fclk is slow, i.e., its phase lags that of bclk, the phase comparator 126 asserts control signal up from the rising edge of bclk to the rising edge of fclk. The up signal causes the charge pump 127 to transfer charge to capacitor 128, effectively pumping its voltage up. This voltage is buffered by voltage follower 130 to provide inverter supply voltage 129. The increase in the inverter supply voltage reduces the delay of inverters 121-125 which reduces the phase difference between bclk and fclk. After many cycles of small adjustments, the phases of bclk and fclk are aligned.

The situation when fclk is too fast is illustrated in FIG. 4. Here the phase comparator 126 asserts control signal down from the rising edge of fclk to the rising edge of bclk. In response to this signal, charge pump 127 transfers charge from capacitor 128 reducing the capacitor voltage. This increases the delay of the inverters 121-125 which slows fclk to bring it into phase with bclk.

In the past, phase comparators have been constructed using flip-flops (c.f., Dally and Poulton pp. 431-433 and p. 617), exclusive-OR gates (c.f., Dally and Poulton pp. 433-434 and pp. 615-617), and sequential logic circuits (c.f., Dally and Poulton pp. 434-436, pp. 459-460, and pp. 617-620). The waveforms in FIGS. 3 and 4 correspond to the output of a sequential phase-only comparator.

The logic diagram of a sequential phase-only comparator (described in Dally and Poulton pp. 459-460, and pp. 617-620) is shown in FIG. 5. This circuit compares the phase of bclk and fclk and generates a pulse on up with width proportional to the phase difference if bclk leads fclk. If fclk leads bclk a pulse is generated on down with width proportional to the phase difference.

When fclk and bclk are exactly aligned, this circuit generates small, equal pulses on both up and down. Generating pulses on both outputs when fclk and bclk are aligned is necessary to prevent a dead band in the phase comparator response at the point of zero phase difference. If no pulses were generated when fclk and bclk are aligned, there would be a range of phase difference about zero, a dead band, where the phase comparator would produce no output and hence would not be able to control the phase difference in the proper direction.

The circuit of FIG. 5 is an asynchronous sequential logic circuit that detects the rising edges of the clock signals. Gates 131 through 136 form a positive edge-triggered flip-flop that is set on the rising edge of bclk. Similarly gates 137 through 142 form a positive edge-triggered flip-flop that is set on the rising edge of fclk. After both rising edges have occurred, the output of gate 143 goes high resetting both flip flops. Thus, each output is high from the time its corresponding input rises until both outputs have gone high. The delays of the gates are adjusted to ensure that both outputs go high before gate 143 resets them, ensuring that there is no dead band in the phase response of the circuit.

A typical prior art charge pump is illustrated in FIG. 7. This circuit accepts up and down inputs from the phase comparator and sources or sinks charge to output capacitor 111. When input up is asserted it switches on FET 161 which enables current-source FET 104 to sink current from node 112. This current is mirrored by current-mirror FETs 105 and 110 to source current onto the output. The duration of the current pulse on the output, and hence the charge deposited on capacitor 111 is directly proportional to the width of the up pulse. When the down input is asserted it switches on FET 162 which enables current source FET 109 to directly sink current from output capacitor 111. The amount of charge removed from the capacitor is directly proportional to the width of the down pulse.

SUMMARY OF THE INVENTION

In accordance with the present invention, a phase comparator compares the phase of first and second timing signals. A window signal that is true during edges of the timing signals is applied with the timing signals to combinational circuitry, circuitry having an output which depends only on the state of the input. The combinational circuitry provides a phase comparison of the edges of the first and second timing signals as an output signal. A feedback circuit from the output signal may control the phase of at least one of the first and second timing signals to thus bring the two signals into proper phase.

Where a phase comparison of the rising edges of the first and second timing signals is made, the window signal is true during the rising edges of the timing signals and false during the falling edges of the timing signals. The window signal may be a phase shifted version of one of the timing signals and may be derived from a counter.

The timing signals and their complements may be ANDed with the window signal. In a specific implementation, the output signal comprises an up signal and a down signal. The up signal is derived by ANDing the window signal with the first timing signal and the complement of the second timing signal, and the down signal is derived by ANDing the window signal with the second timing signal and the complement of the first timing signal.

In a preferred implementation, the output signal is generated by sourcing current to the output when the first timing signal leads a second timing signal and draining current from the output when the first timing signal lags the second timing signal. The current is sourced and drained to and from charge storage such as a capacitor. A feedback signal from the stored charge controls the phase of at least one of the first and second timing signals.

A phase comparison may be made on both the rising edges and the falling edges of the first and second timing signals. A comparison of falling edges of the first and second timing signals may be provided in second combinational circuitry. The second combinational circuitry receives a window signal which is true during the falling edges of the timing signals and false during the rising edges of the timing signals.

In a preferred implementation, the combinational circuitry which performs the comparison comprises a switching device gated by the window signal in series with a subcircuit of switching devices. The subcircuit includes a switching device gated by the first timing signal in series with a switching device gated by the complement of the second timing signal. The combinational circuitry may include two branches, a first branch gating current that causes current to source to the output storage and a second branch gating current that causes current to be sunk from the output storage. The first branch may be a pull down branch, and the combinational circuitry may include a current mirror to source current to the output storage. Alternatively, the first branch may be a pull up branch.

Preferably, the first branch includes a first switching device gated by the window signal, a second switching device gated by the first timing signal and a third switching device gated by a complement of the second timing signal, the three switching devices being in series. The circuit may further comprise fourth and fifth switching devices gated by the first and second timing signals, respectively, the fourth and fifth switching devices being coupled in parallel with the second and third switching devices. The fourth and fifth switching devices are coupled in series with each other in an order opposite to the order in which the second and third switching devices are connected in series.

The phase comparator may be utilized in a frequency multiplier circuit. In that implementation, the phase comparator is combined with a frequency generating circuit such as a voltage controlled oscillator which generates an output signal at a frequency that is a multiple of an input frequency. The phase comparator provides a phase comparison of an edge of the input signal and an edge of the output signal and controls the frequency generating circuit based on the comparison. Preferably, a divider divides the frequency of the output signal to provide the window signal.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Prior art phase comparators suffer from two disadvantages. First, they are composed of many logic gates that switch on every cycle of clocks being compared. This requires considerable chip area to realize the logic gates and considerable power for the switching. For example, the sequential phase-only comparator of FIG. 5 requires 13 logic gates and, implemented with typical 0.25 μm CMOS standard cells, switches about 200 fF of capacitance on each clock transition. With a 1 GHz clock this draws about 0.5 mA of current from a 2.5V supply and dissipates 1.25 mW.

Figure 5:
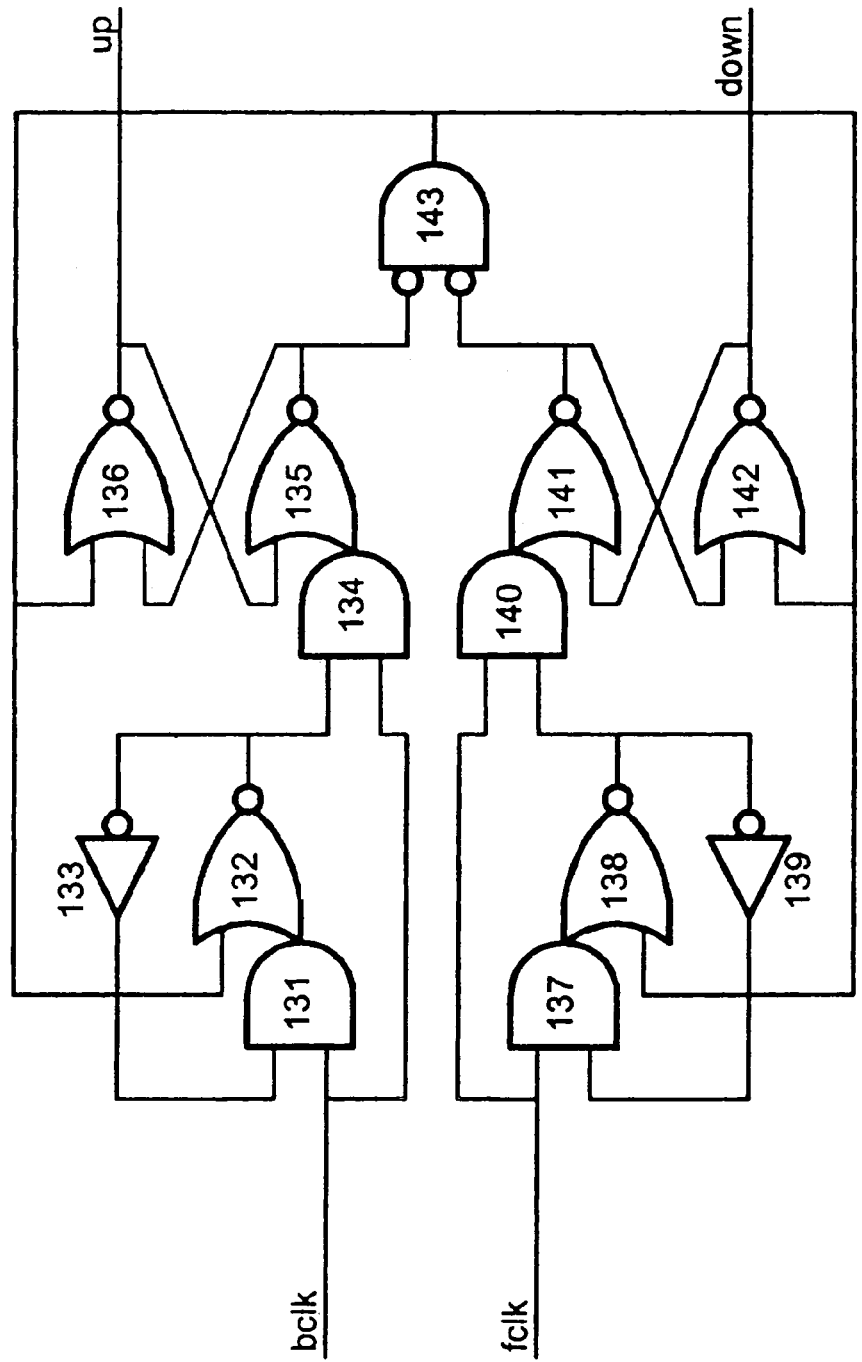
FIG. 5 illustrates a prior art phase comparator.

Second, mismatches in the delay of the logic gates in the phase comparator often lead to significant phase offsets. That is, the loop locks not with bclk and fclk in phase, but with them out of phase by an amount determined by mismatches in the delay of the logic gates in the phase comparator. In FIG. 5, for example, if the delay of gates 134 through 136 is greater than the delay of gates 140 through 142, the down pulse will be wider than the up pulse when fclk and bclk are in phase. This will drive the charge pump to slow the delay line, causing fclk to lag bclk when converged. The lag remaining when the loop is locked is the phase offset.

Figure 3:
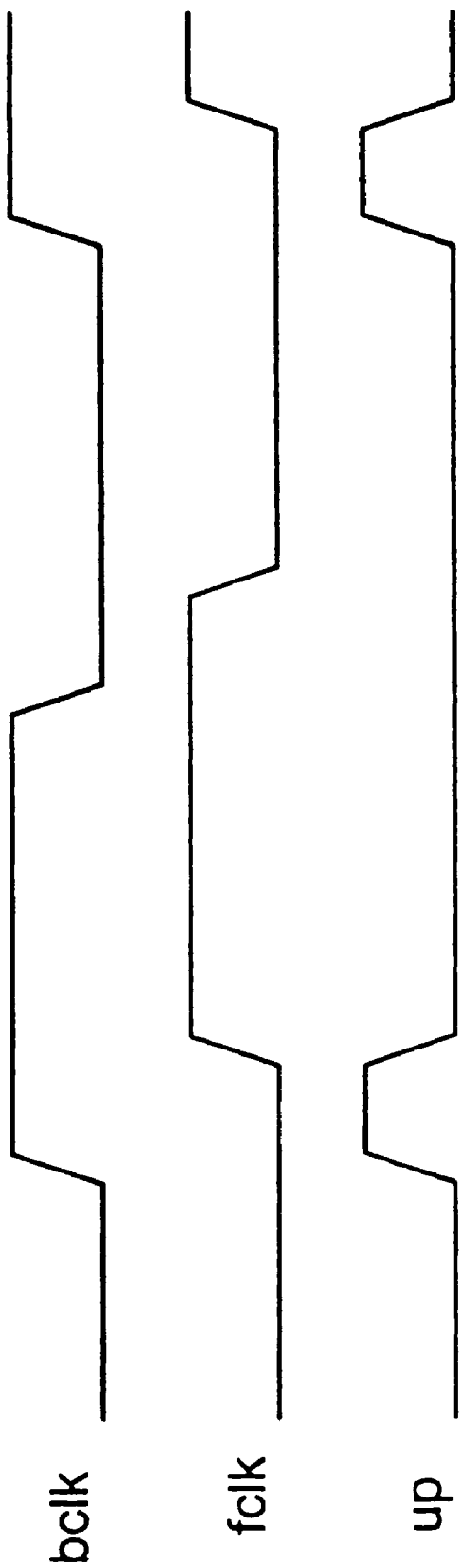
FIG. 3 is a signal diagram for the circuit of FIG. 1 with the timing signal bclk leading the signal fclk.
Figure 4:
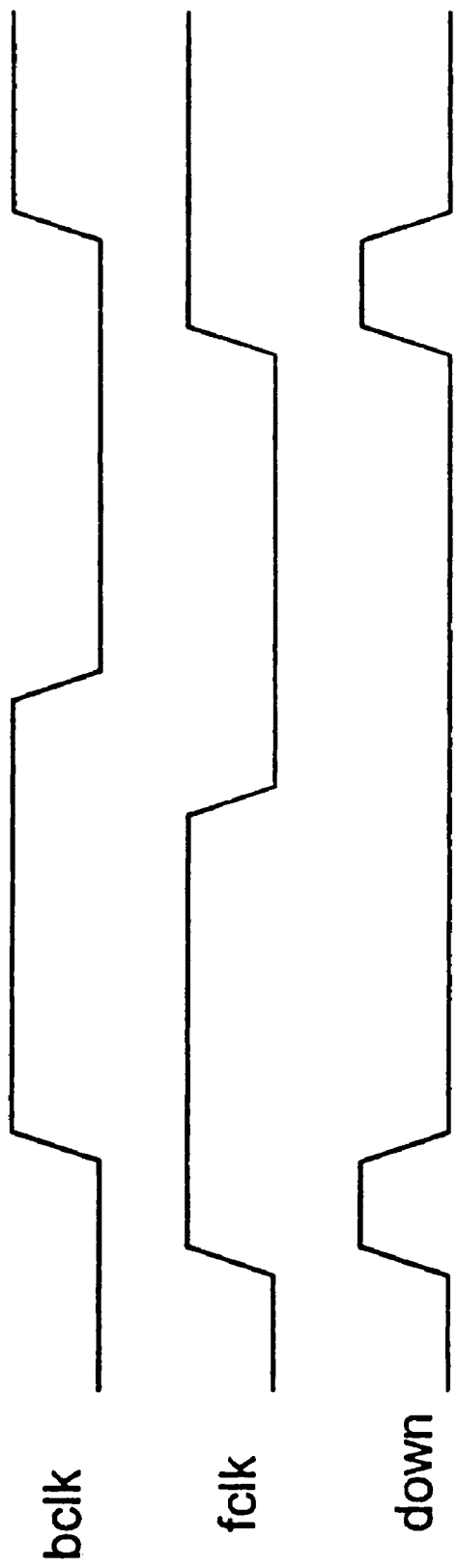
FIG. 4 illustrates a signal timing diagram for the circuit of FIG. 1 where the signal bclk lags the signal fclk.

The present invention solves the problems of excessive area and power and the problem of phase offset due to gate mismatch in two steps. First, to reduce the area and power required to build a phase comparator, we take advantage of the fact that the up pulse corresponds to a period of time when bclk is high and fclk is low (see FIG. 3). Unfortunately we cannot combinationally decode up off of these two signals, because the state where bclk=1 and fclk=0 also occurs after the falling edge of fclk when fclk leads bclk (see FIG. 4). However we can discriminate these two states by generating a signal that is high during a period that includes the rising edges of the two clocks and low during a period that includes the falling edges of the two clocks. Such a signal is easy to generate and is often already present in a DLL or PLL. For example, signal eclk in FIG. 2 leads fclk by 90 degrees and has the desired property as long as bclk and fclk are not out of phase by more than 90 degrees.

Figure 2:
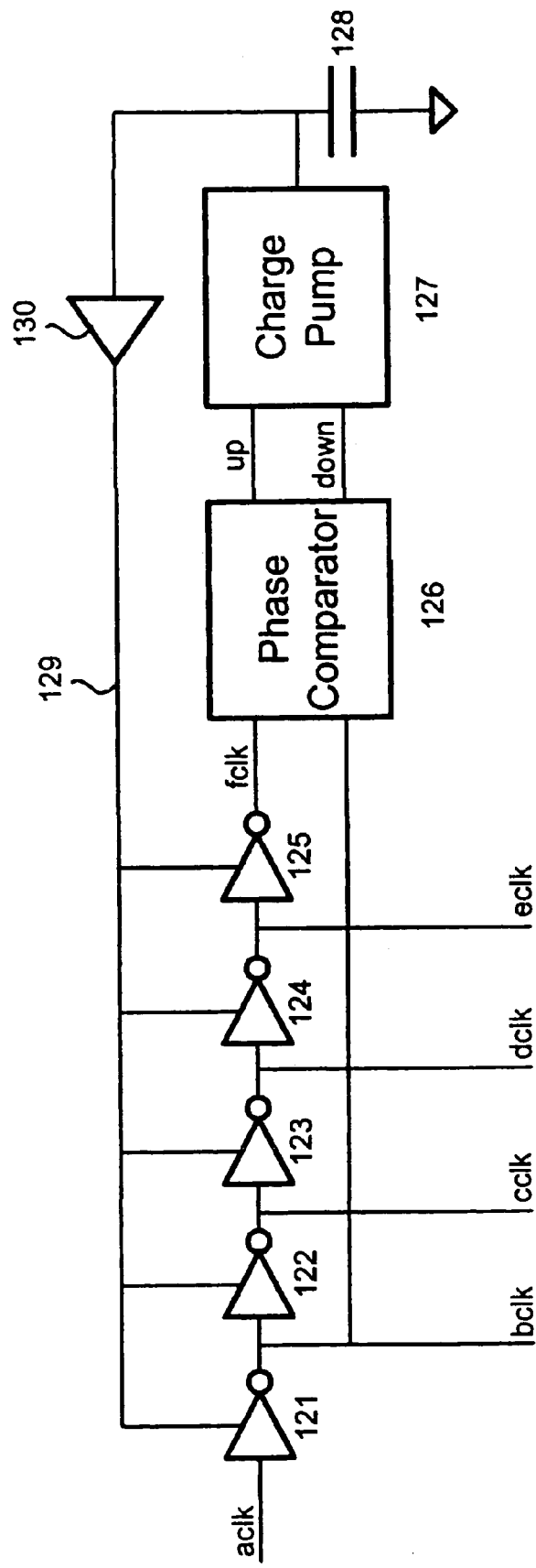
FIG. 2 illustrates a prior art delay-locked loop circuit including a delay line, phase comparator and charge pump circuit.
Figure 6:
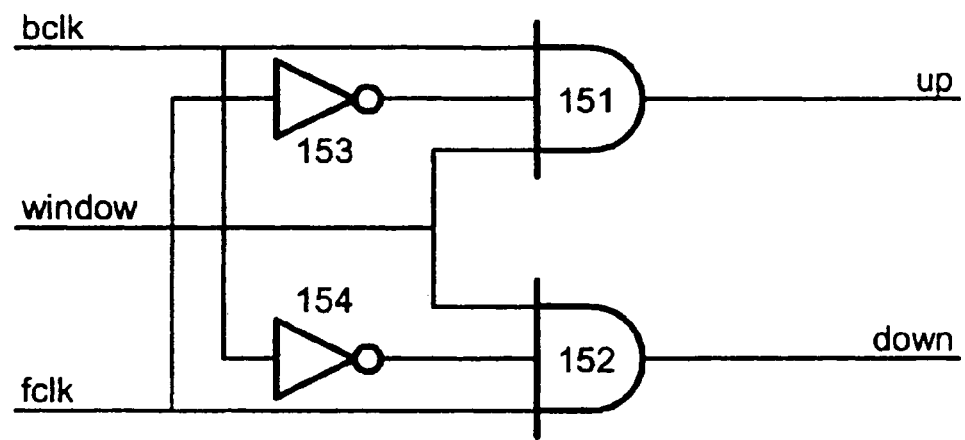
FIG. 6 illustrates the combinational circuitry of a comparator of the present invention.

FIG. 6 shows a phase comparator that operates combinationally by combining bclk and fclk along with a window signal such as eclk in FIG. 2. When bclk is high and fclk is low during the window, the up signal is asserted by AND gate 151. Similarly when fclk is high and bclk is low during the window, the down signal is asserted by AND gate 152. Inverters 153 and 154 serve both to provide complements of bclk and fclk if they are not already available, and to widen the up and down pulses to ensure there is no dead-band in the phase comparator. Without these inverters, the inertial delay of gates 151 and 152 would cause the up and down signals to remain low when bclk and fclk are nearly in phase, resulting in a dead-band region of phase where the comparator has no output. Compared to the sequential phase-only comparator, this design requires only four gates and hence requires significantly less chip area and power.

Figure 1:
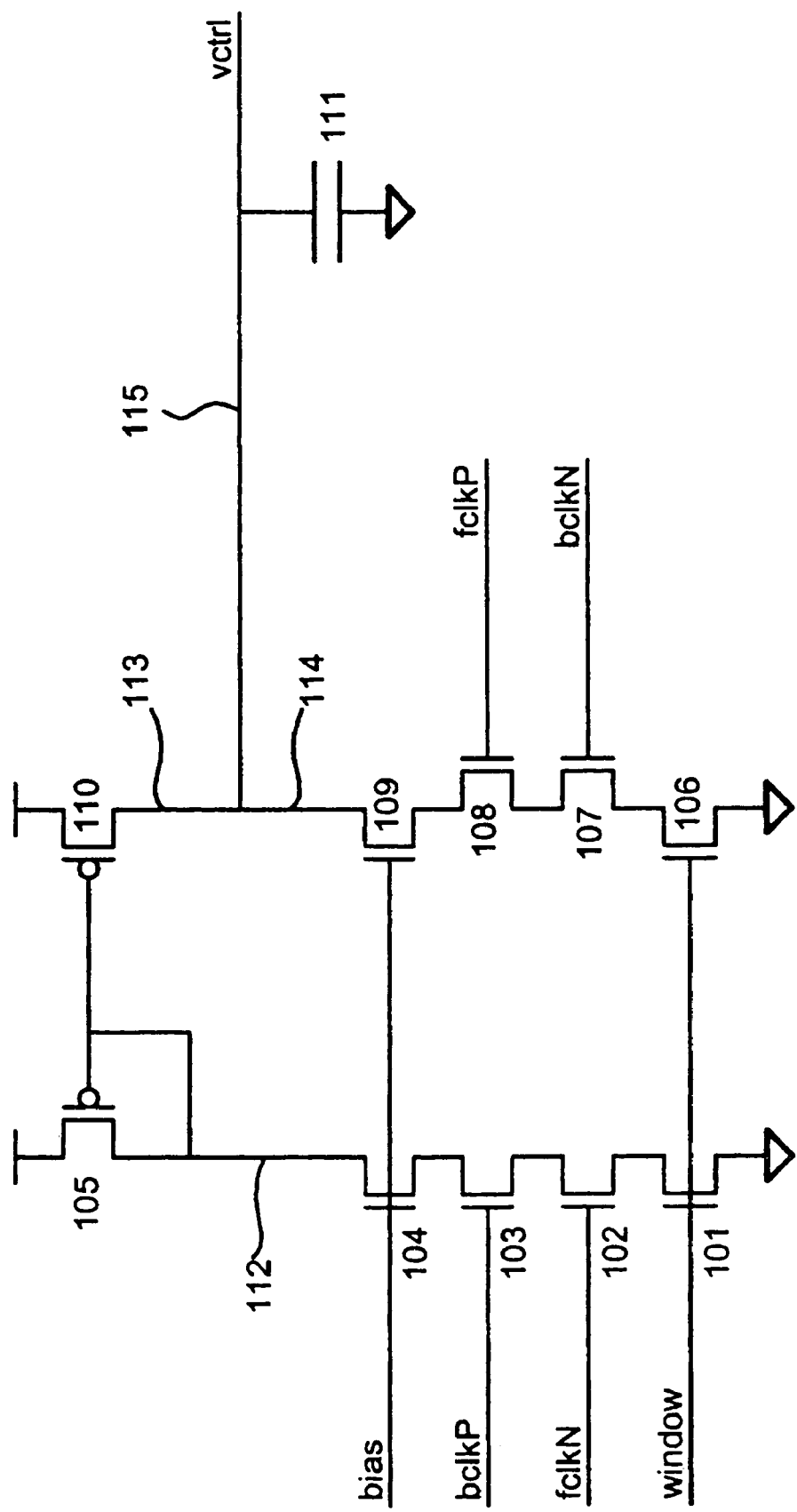
FIG. 1 is a schematic diagram of a circuit embodying the present invention which combines a phase comparator and a charge pump.

The performance of the phase comparator and charge pump can be improved significantly by combining the two blocks into a single circuit that generates the up and down signals directly as currents flowing in the two branches of the charge pump as shown in FIG. 1. The circuit of FIG. 1 combines the functionality of the phase comparator of FIG. 6 and the charge pump of FIG. 7. However, rather than generate the up and down pulses as voltage mode signals using AND gates 151 and 152, the combined circuit generates the up and down pulses directly as currents. The up current pulse is generated by gating current source FET 104 by the series combination of FETs 101, 102, and 103. These three FETs are switched on only when the window signal is high, bclkP (the high-true version of bclk) is high, and fclkN (the low-true version of fclk) is low. In most applications, complementary clocks, fclkP and fclkN (also bclkP and bclkN) are generated by differential clock circuits that generate the true and complement versions of the clock signal exactly in phase. In a similar manner, series FETs 106, 107, and 108 gate the down current source on only when window is high, bclk is low, and fclk is high.

The series combination of FETs 101-103 in FIG. 1 provide the same logical function as AND-gate 151 in FIG. 6, but with three significant advantages. First, because the up signal is never generated as a voltage-mode signal, no power is dissipated switching this signal high and then low each cycle. Second, this circuit is considerably simpler, requiring only 10 FETs for both the phase comparator and charge pump compared to 46 FETs for the combination of FIGS. 6 and 7. This reduces chip area, power, and complexity. Finally, phase offsets due to mismatches in the delay of the gates in the phase comparator are eliminated because the gates themselves are eliminated.

Figure 8:
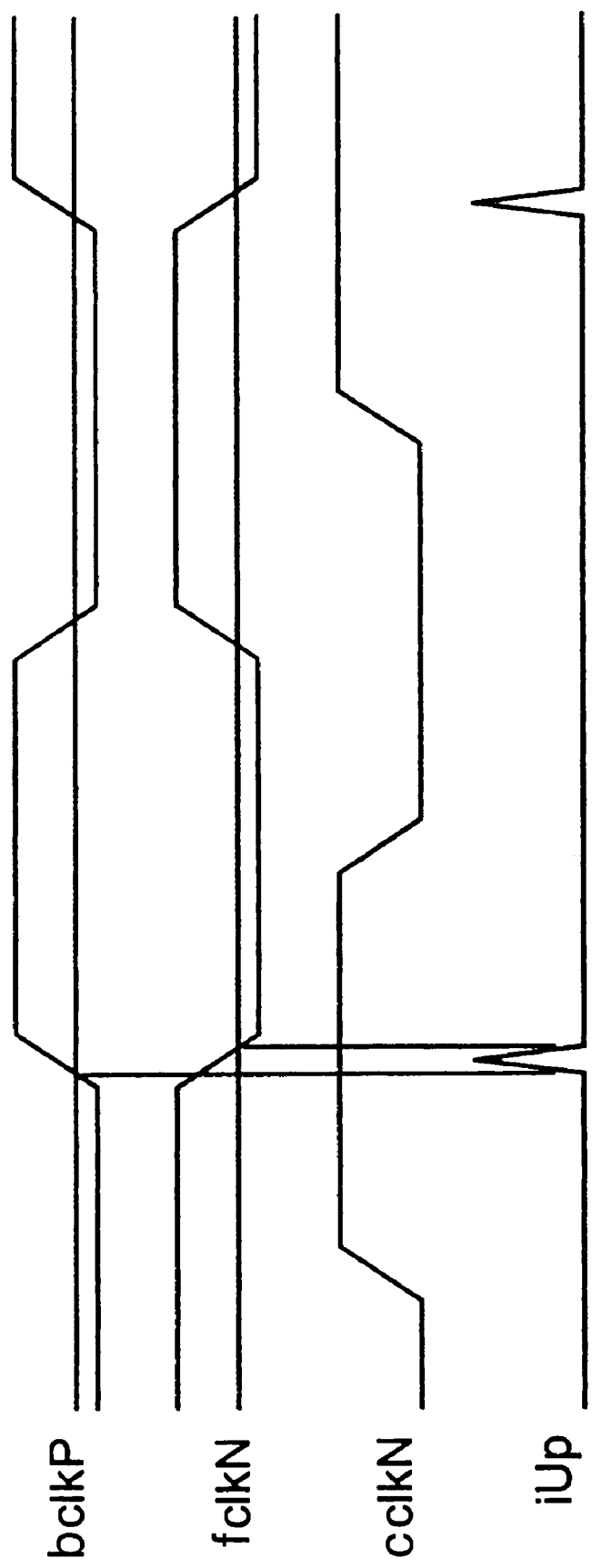
FIG. 8 shows waveforms for the operation of the combined phase detector and charge pump circuit of FIG. 1 where the clock signals bclk and fclk are aligned.

FIG. 8 shows waveforms for the operation of the combined phase detector and charge pump circuit of FIG. 1 for the case where clocks bclk and fclk are aligned. This figure illustrates how deadband is avoided in the phase comparator without adding delay to either of the clocks. Clock cclkN, which has the same phase as clock eclkP (not shown), is used here as the window signal to discriminate the two periods where bclk and fclk overlap.

During the period when cclkN is high, the left branch of the charge pump, devices 101-104 conducts current whenever bclkP and fclkN are both above the NFET threshold voltage, depicted in the figure as a horizontal dashed line. Signal bclkP crosses the threshold voltage shortly after it begins switching, starting the flow of up current through wire 112 at the point denoted by the vertical dashed line. A short period of time later, signal fclkN falls through the threshold voltage ending the flow of up current at the point denoted by the second vertical dashed line. The overlap of the above threshold regions of signals fclkP and bclkN induce an identical pulse of down current in wire 114 (not shown in the figure). Thus, when the clocks are aligned identical current pulses are generated in the up and down branches of the charge pump.

Figure 9:
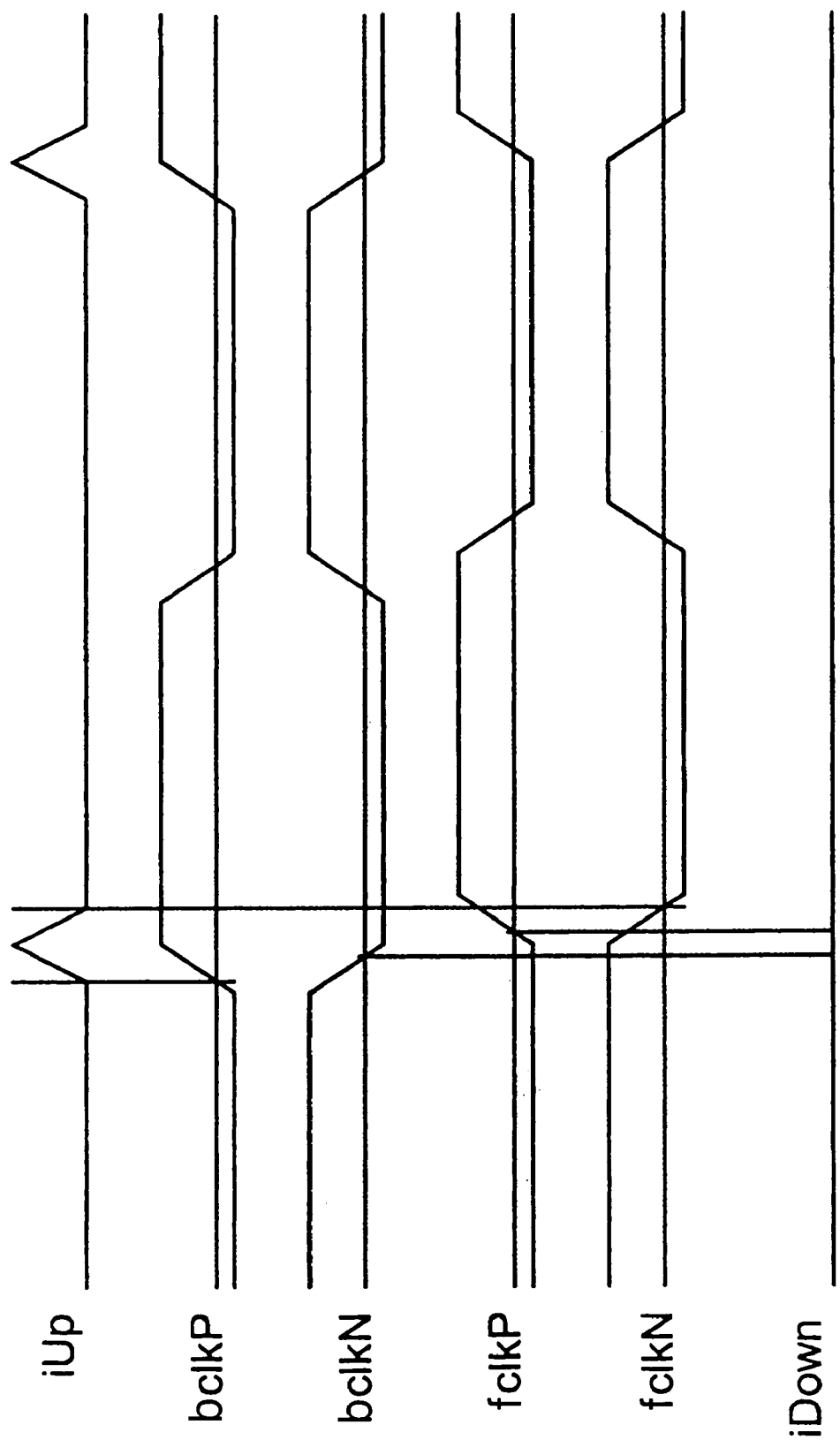
FIG. 9 illustrates the waveform for the circuit of FIG. 1 where the signal bclk leads the signal fclk.

If fclk lags bclk, the situation when the delay line is too slow, the up pulse will be triggered on sooner, by bclkP crossing its threshold, and the down pulse will be triggered later, by fclkP crossing its threshold. Thus, as the amount by which fclk lags bclk increases, the up pulse gets wider and the down pulse gets narrower, resulting in a net sourcing of current to the charge pump capacitor. At the point where the lag between fclk and bclk is equal to the pulse width of the current pulse when the clocks were aligned, the down pulse is eliminated entirely. This situation is depicted in FIG. 9. Similarly when bclk lags fclk, the down pulse is widened by the amount of the lag and the up pulse is narrowed by the amount of the lag with the up pulse being eliminated at the point where the lag equals the original pulse width.

Figure 7:
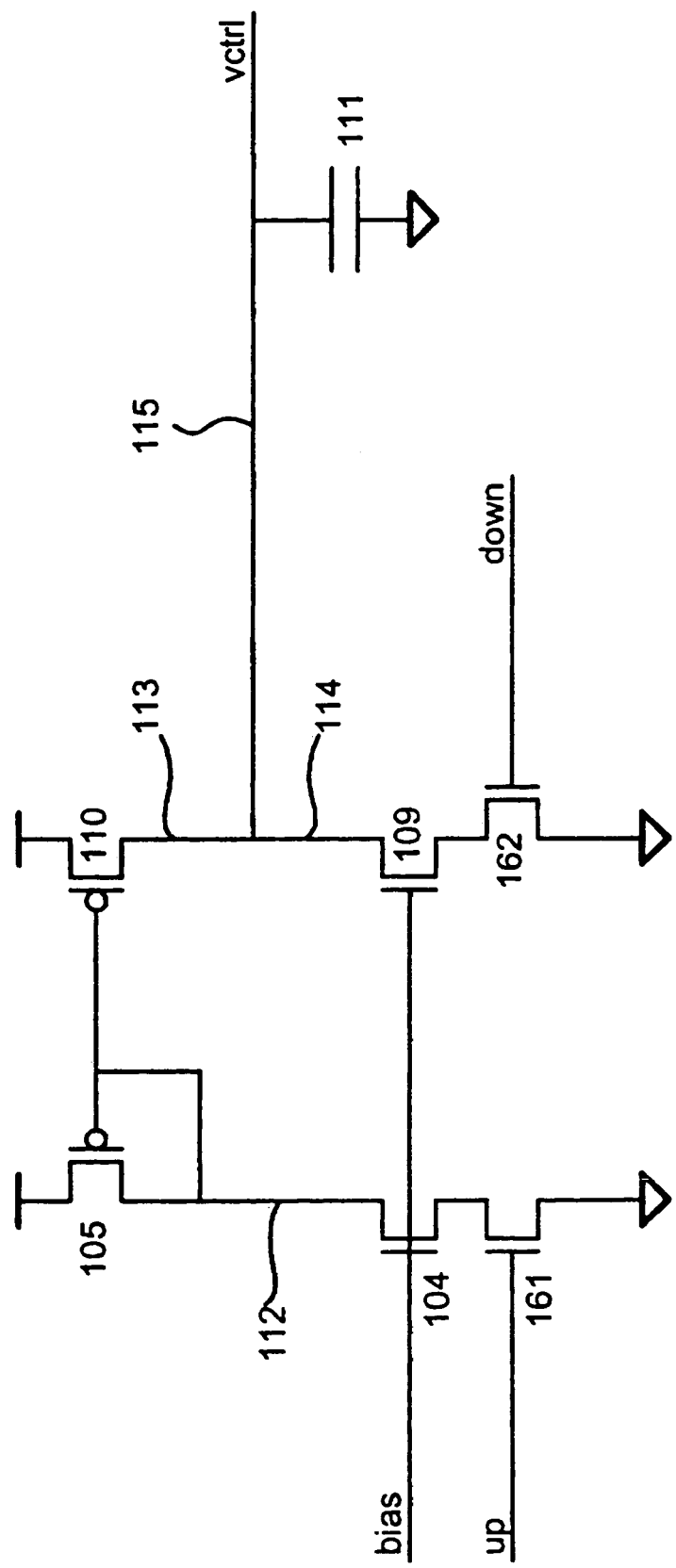
FIG. 7 illustrates a prior art charge pump used in the circuit of FIG. 2.

The circuit of FIG. 1 has significantly less phase offset than the prior art combination of FIG. 5 and FIG. 7 for two reasons. Both reasons derive from the fact that the circuit of FIG. 1 operates with no deadband without the need to delay the clocks to generate a non-zero pulse width when the clocks are aligned. First, the contribution to the phase offset of any mismatch in the gates used to generate the up and down pulses is eliminated. The clocks are input directly to the charge pump, thus there are no gates whose delay mismatch contribute to phase error. Second, the contribution of phase error from device mismatch in the two branches of the charge pump is reduced because the width of the current pulses when the clocks are aligned is reduced. With the circuit of FIG. 1, when the clocks are aligned, the up and down current pulses have a width which is a fraction of a signal rise time, about 20 ps in a typical process. In contrast, the prior art phase detector has a pulse width that is approximately one gate delay, about 100 ps in a typical process. The sensitivity of phase offset to device mismatch in the charge pump is proportional to this pulse width. Thus the circuit of FIG. 1 reduces this component of phase offset by approximately a factor of 5.

Figure 10:
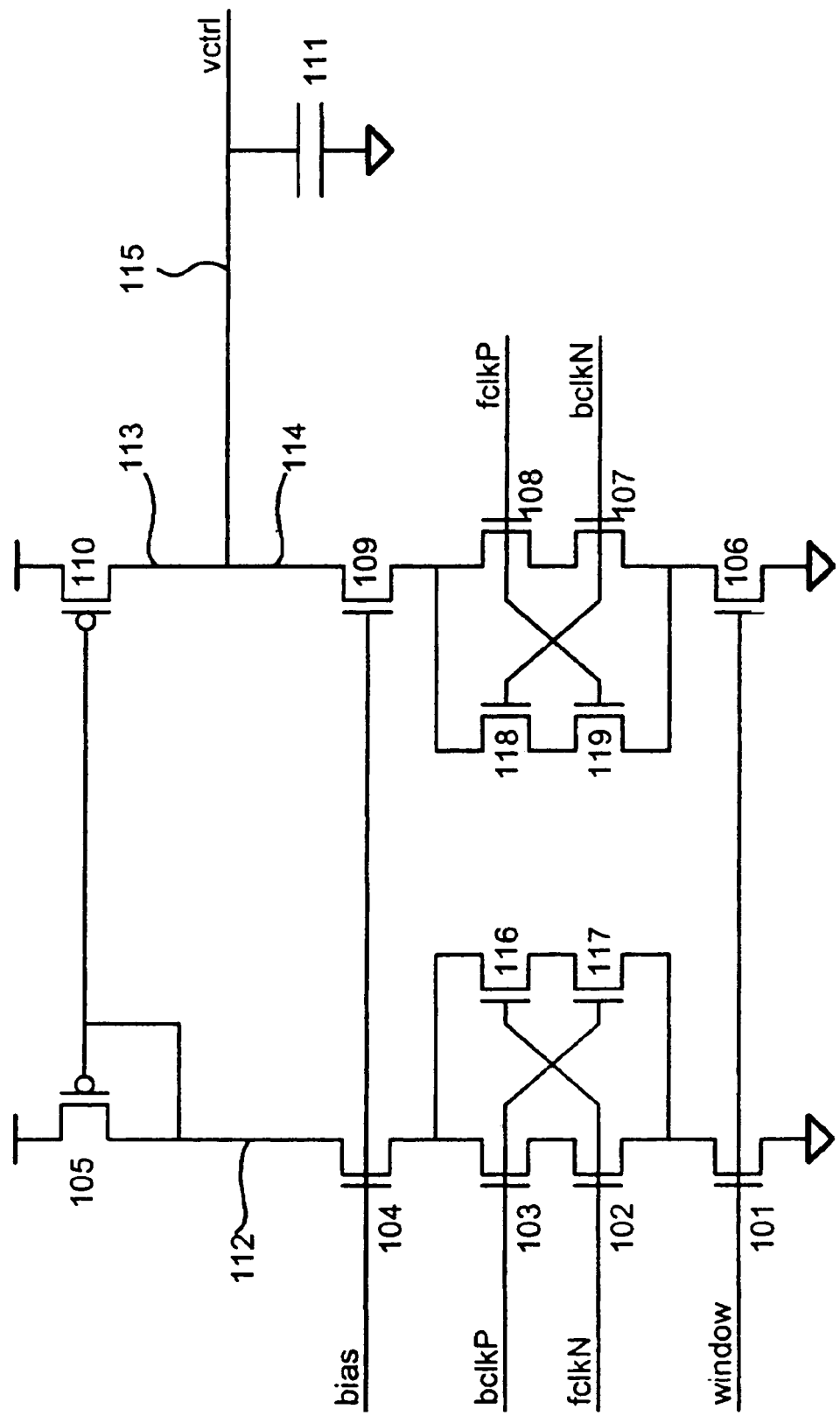
FIG. 10 illustrates an alternative embodiment of the invention which reduces phase offset of the circuit of FIG. 1.

FIG. 10 shows a combined phase comparator and charge pump that improves upon the circuit of FIG. 1. This circuit adds four devices 116-119. Devices 116 and 117 are wired in parallel with devices 103 and 102 and are controlled by the same gate signals, but are connected in the opposite order. Devices 116 and 117 are logically redundant with devices 102 and 103 and act to make the circuit symmetric with respect to the two clock inputs, so neither of the clock inputs is on 'top' of the other. Similarly devices 118 and 119 are wired in parallel with devices 107 and 108 but in the opposite order. The symmetric circuit of FIG. 10, while slightly more complex than the circuit of FIG. 1 offers further reduced phase offset by eliminating offsets in the thresholds, and hence switching points of the devices due to the stacking order of the transistors.

Figure 11:
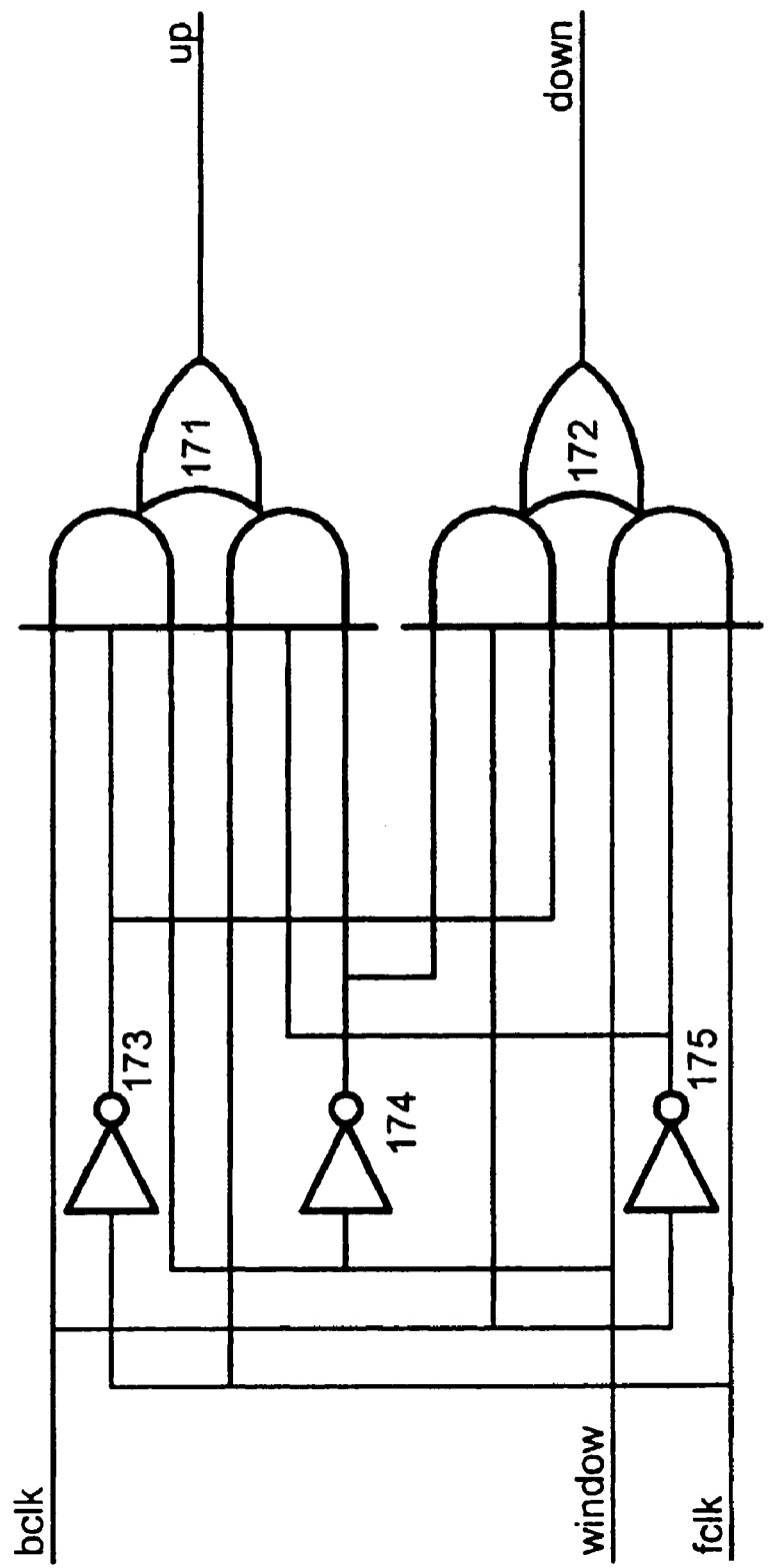
FIG. 11 illustrates an alternative embodiment of the invention which compares both edges of a clock signal.
Figure 12:
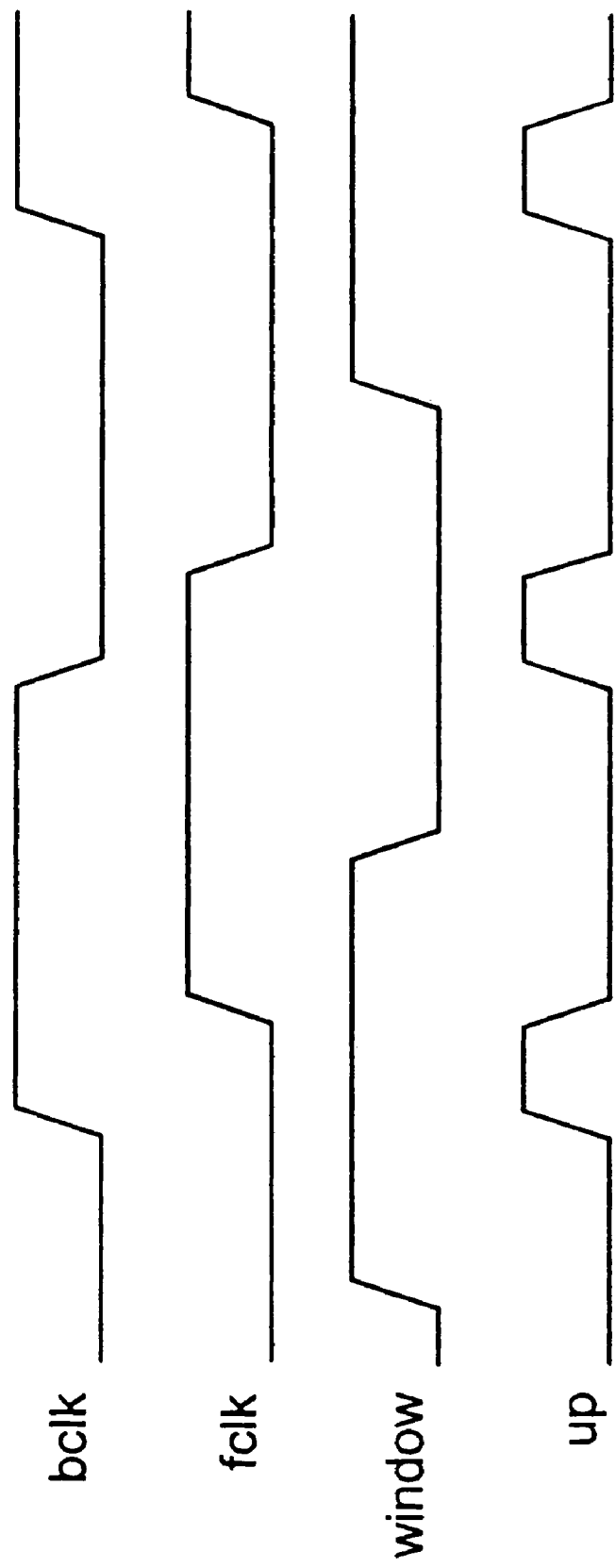
FIG. 12 illustrates the signal waveforms of the circuit of FIG. 11 when bclk leads fclk.

The phase comparators discussed to this point all compare the phase of just the rising edge of the clock. In some applications it is desirable to compare the phases of both the rising and falling edges of the clock. A phase comparator that compares both edges of the clock is illustrated in FIG. 11 and waveforms showing operation of this phase comparator are shown in FIG. 12. Compared to the phase comparator of FIG. 6, AND gates 151 and 152 have been replaced by AND-OR gates 171 and 172. The upper AND branch of gate 171 duplicates the function of gate 151 in FIG. 6 to compare the phase of the rising edge of the clocks. This gate asserts the up output when bclk is high and fclk is low while window is asserted. The lower AND branch of gate 171 compares the falling edge of the two clocks. As illustrated in the waveforms of FIG. 12, when bclk is low, fclk is high, and window is low, up is also asserted via this branch. In a similar manner, the lower branch of gate 172 duplicates the function of gate 152, comparing the rising edges of the clocks, while the falling edges of the clocks are compared by the upper branch of gate 172.

Figure 13:
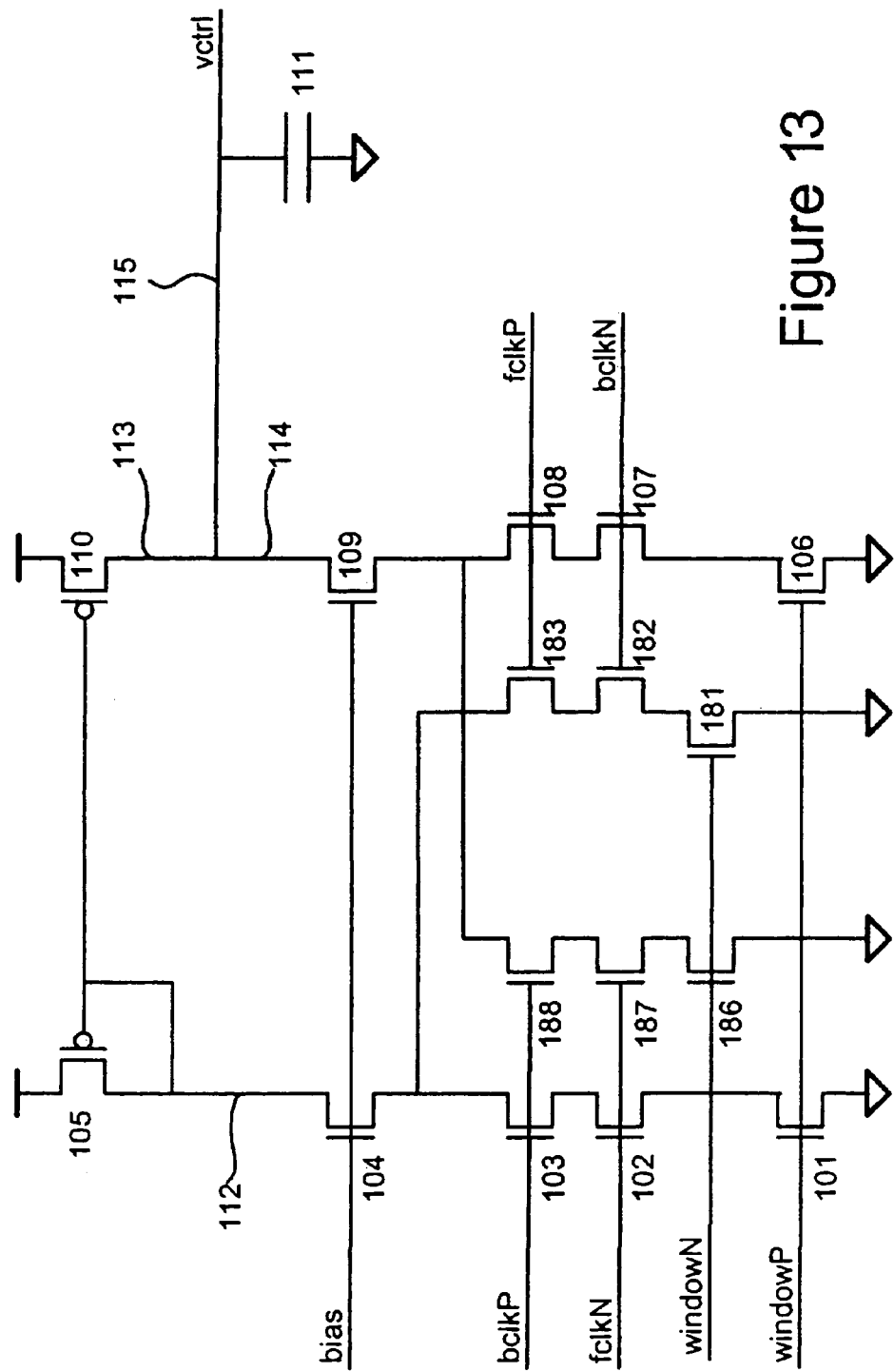
FIG. 13 is an electrical schematic diagram of an embodiment of the invention which compares both edges of the clock signal.

A combined phase comparator and charge pump that compares both edges of the clocks is illustrated in FIG. 13. This circuit duplicates the logic of FIG. 11 but generates the up and down signals as current pulses in the two branches of the charge pump as is done in the circuit of FIG. 1, obviating the need for voltage-mode up and down signals. In this circuit, FETs 181-183 perform the same logic as the bottom branch of AND gate 171 in FIG. 11 and FETs 186-188 form the bottom branch of AND gate 172 in FIG. 11. One skilled in the art will understand that this circuit can be improved by adding additional devices to make each pair symmetric in the style of FIG. 10.

Figure 17:
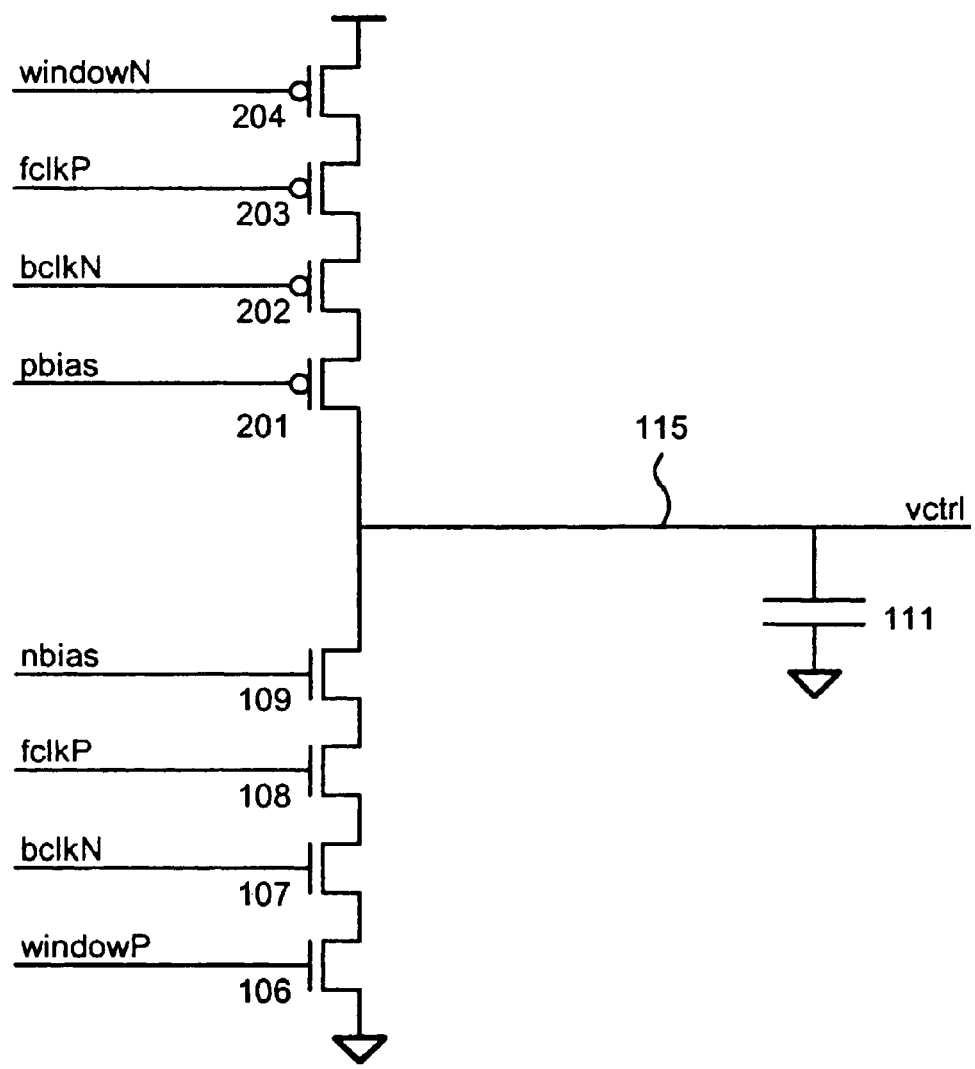
FIG. 17 is a schematic circuit diagram of an alternative embodiment of the invention including a pull up circuit.

An alternate embodiment of the invention employing a push-pull circuit in place of the current mirror is illustrated in FIG. 17. In this circuit, when bclk leads fclk, PFETs 202 to 204 will all have their gates low during the window, and thus the pull-up branch of the circuit (PFETs 201 through 204) will source current onto the output. The pull-down branch of the circuit is unchanged from FIG. 1. When fclk leads bclk, NFETs 106 through 108 all have their gates high during the window and hence the pull-down branch of the circuit sinks current from the output under this condition. Because it dispenses with the current mirror, this circuit is simpler than the circuit of FIG. 1, but is subject to small phase offsets due to mismatches between the PFET and NFET threshold voltages and imbalance in the duty factors of the input signals.

Figure 14:
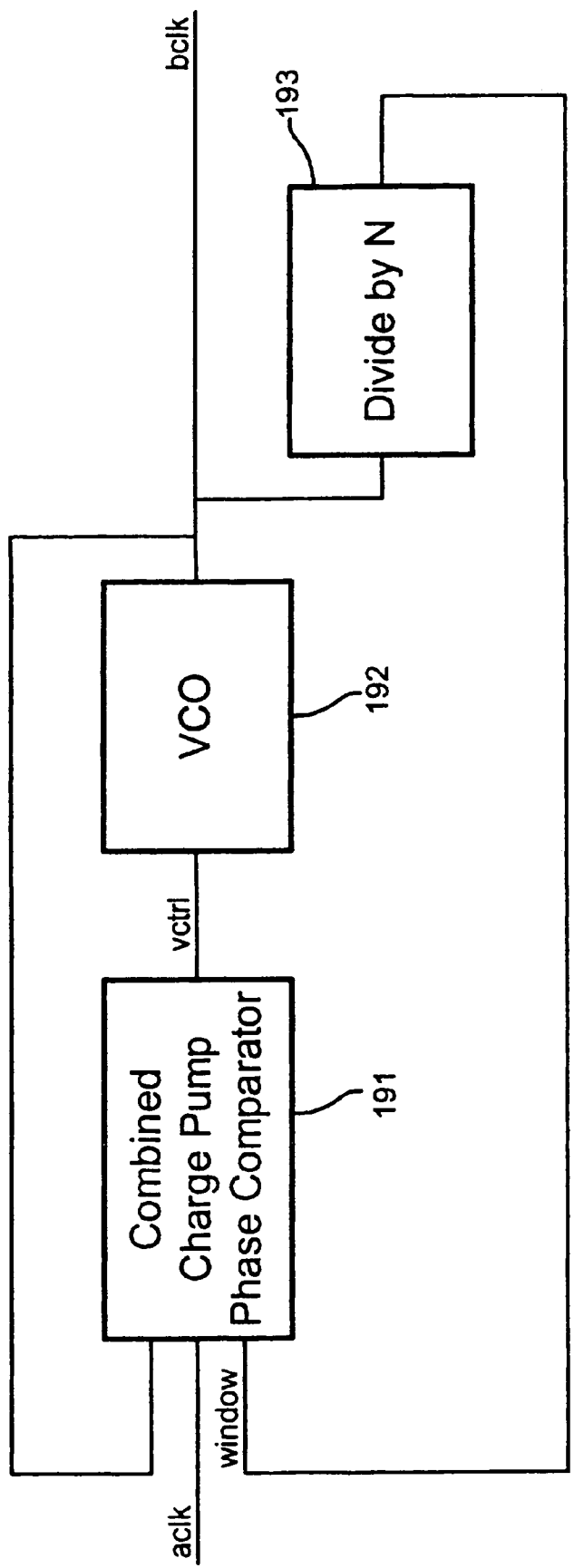
FIG. 14 shows the combined phase comparator charge pump in a clock multiplier circuit.
Figure 15:
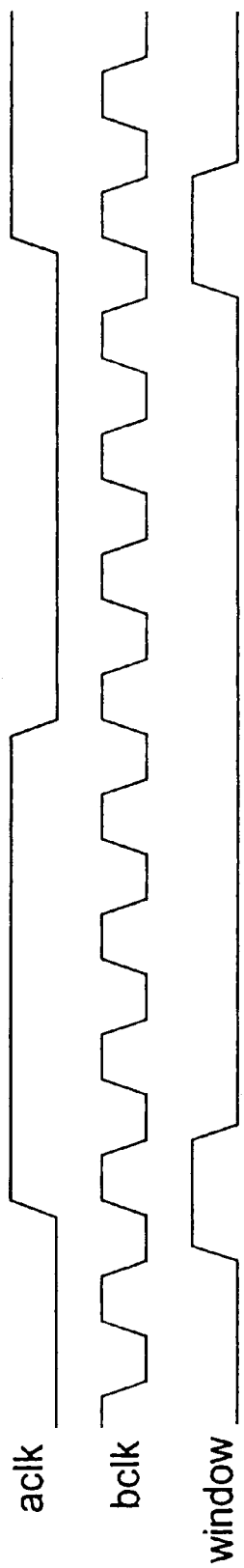
FIG. 15 illustrates signal waveforms for the circuit of FIG. 14.
Figure 16:
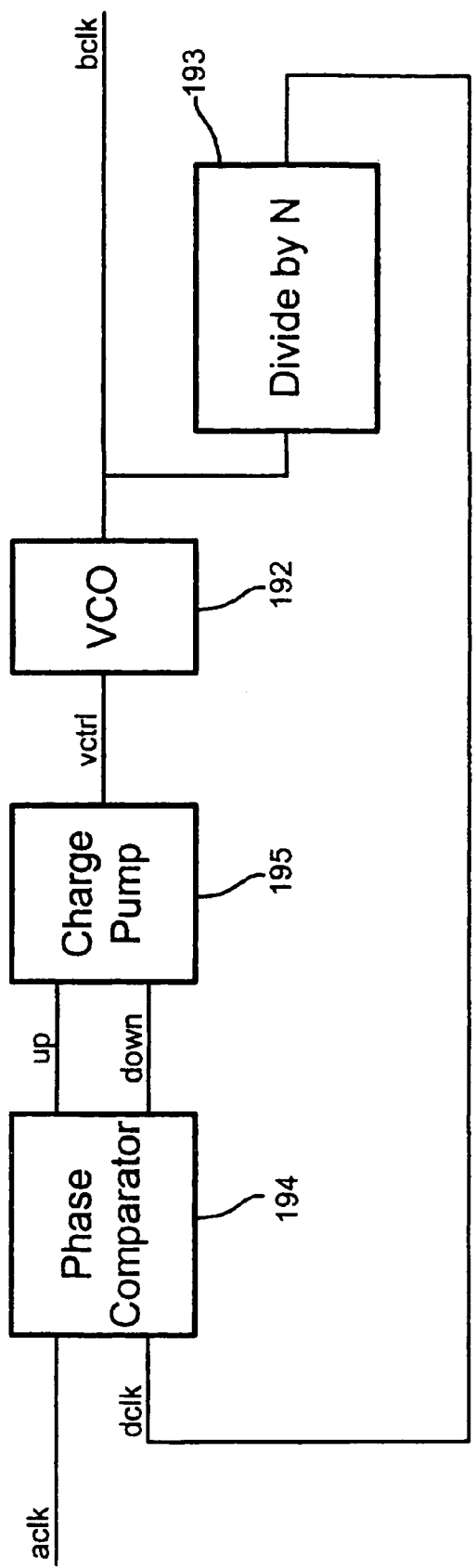
FIG. 16 illustrates a prior art multiplier circuit.

FIG. 14 shows the use of the combined phase comparator charge pump in a clock multiplier circuit. The waveforms for this circuit are illustrated in FIG. 15. In the prior art, clock multipliers operate as illustrated in FIG. 16, by dividing the output of VCO 192 in a divide by N counter 193 to generate a clock, dclk, of the same frequency as input clock, aclk. These two clocks of the same frequency are then compared using a conventional phase comparator 194 and charge pump 195. The output of the charge pump adjusts the frequency of the VCO. In the prior art circuit of FIG. 16, the input clock, aclk, is phase locked not to the high frequency output clock, bclk, but rather to the output of the divider, dclk. Thus, even when the loop is locked, the edges of aclk and bclk are not aligned.

The windowed phase comparator of FIG. 6 and FIG. 1 enables a direct comparison of two clocks of different frequencies, aclk and bclk, in FIG. 14 by enabling the window signal during the one rising edge of aclk that corresponds to the rising edge of bclk. The waveforms of FIG. 15 illustrate the operation of this circuit. The figure shows operation where the clock is multiplied by four. That is, bclk has a frequency that is four times the frequency of aclk, and counter 193 is a divide-by-4 counter. The divide-by-4 counter 193 is clocked off the falling edge of bclk and produces a one-clock-wide pulse every four clock periods. This pulse is used as the window signal to the combined phase comparator and charge pump 191. The phase comparator compares the rising edge of bclk that occurs during this window to the rising edge of aclk and adjusts the control voltage to the VCO 192 accordingly. Thus, once the loop has acquired lock, the rising edges of aclk and bclk are exactly aligned, within the phase offset of the phase comparator.

One skilled in the art will understand that several variations are possible on the preferred embodiment described here. For example, while the preferred embodiment uses a current-mirror charge pump, the combined charge-pump phase comparator described here can also be realized in the form of a fully-differential charge pump (see Dally and Poulton p. 627) or a push-pull charge pump (see Dally and Poulton p. 626).

While this invention has been particularly shown and described with references to preferred embodiments thereof, it will be understood by those skilled in the art that various changes in form and details may be made therein without departing from the scope of the invention encompassed by the appended claims.

What is claimed is:

1. A multiplier circuit for multiplying an input frequency of an input clock signal, comprising:
    an oscillator circuit to generate an output clock signal having an output frequency that is higher than and a multiple of the input frequency; and
    a phase comparator to receive the input clock signal and the output clock signal, the phase comparator comparing a phase of the input clock signal with a phase of the output clock signal and controlling the oscillator circuit based on the comparison;
    wherein the comparator is to receive a window signal derived from the output clock signal, the comparator comparing the phase of the input clock signal and the phase of the output signal in response to the window signal.

2. A multiplier as claimed in claim 1 wherein the output frequency is N times the input frequency, the multiplier further comprising a divide-by-N counter to provide the window signal from the output signal.

3. A multiplier circuit as claimed in claim 1 wherein the phase comparator includes a capacitor and transistors having gates receiving respective ones of the input clock signal, the output clock signal, and the window signal, at least one current signal being generated in the transistors and supplied to the capacitor to generate a control signal dependent on the at least one current signal, the control signal controlling the oscillator circuit.

4. A multiplier circuit of claim 3 wherein the phase comparator includes a first transistor receiving the input clock signal, a second transistor serially coupled to the first transistor and receiving a complement of the output clock signal, a third transistor receiving the output clock signal, and a fourth transistor serially coupled to the third transistor and receiving a complement of the input clock signal, the at least one current signal including a first current signal through the first and second transistors and a second current signal through the third and fourth transistors.

5. A multiplier circuit of claim 4 wherein the comparator is to receive a window signal and wherein the phase comparator further includes a fifth transistor serially coupled with the first and second transistors to receive the window signal and a sixth transistor serially coupled with the third and fourth transistors to receive one of the window signal and a complement of the window signal.

6. A method of frequency multiplying comprising:
    generating an output clock signal having an output frequency that is higher than and a multiple of an input frequency of an input clock signal;

comparing a phase of the input clock signal with a phase of the output clock signal and controlling the output clock signal based on the comparison; and generating a window signal from the output clock signal, the window signal defining a time period for comparing the phases of the input and output clock signals.

7. A method as claimed in claim 6 wherein the output frequency is N times the input frequency and the window signal includes one pulse for every N clock periods of the output clock signal.

8. A method as claimed in claim 7 wherein the output clock signal is applied to a divided-by-N counter to generate the window signal.

9. A method of frequency multiplying comprising:

generating an output clock signal having an output frequency that is higher than and a multiple of an input frequency of an input clock signal; and comparing a phase of the input clock signal with a phase of the output clock signal and controlling the output clock signal based on the comparison, the step of comparing comprising:

generating a first current signal depending on a timing difference between an edge of the input clock signal and an edge of a complement of the output clock signal; and generating a second current signal depending on a timing difference between an edge of a complement of the input clock signal and an edge of the output clock signal.

10. A method as claimed in claim 9, further comprising generating a control signal depending on the first and second current signals, the control signal controlling the output clock signal.

11. A multiplier circuit to multiply an input frequency of an input signal, comprising:

an oscillator circuit to generate an output signal according to a control signal, the output signal to have an output frequency that is a multiple of an input frequency of the input signal;

an output capacitor; and a phase comparator including transistors having gates to receive respective ones of the input and output signals, the phase comparator to generate at least one current signal through the transistors, the at least one current signal being dependent on a phase difference between the input and output signals and supplied to the output capacitor to generate the control signal;

wherein the phase comparator includes a first transistor receiving the input signal, a second transistor serially coupled to the first transistor and receiving a complement of the output signal, a third transistor receiving the output signal, and a fourth transistor serially coupled to the third transistor and receiving a complement of the input signal, the at least one current signal including a first current signal through the first and second transistors and a second current signal through the third and fourth transistors.

12. A multiplier as claimed in claim 11 wherein the comparator is to receive a window signal and wherein the phase comparator further includes a fifth transistor serially coupled with the first and second transistors to receive the window signal and a sixth transistor serially coupled with the third and fourth transistors to receive one of the window signal and a complement of the window signal.

13. A multiplier circuit as claimed in claim 12 wherein the output frequency is N-times the input frequency and the phase comparator further includes a divide-by-N counter to generate the window signal from the output signal.

14. A multiplier circuit as claimed in claim 11 wherein the comparator further includes additional transistors in parallel with and logically redundant with the first and second transistors.

15. A method of frequency multiplying, comprising:

generating an output signal to have an output frequency that is a multiple of an input frequency of an input signal;

applying at least some of the input and output signals and their derivatives and complements to respective gates of transistors to generate at least one current signal through the transistors, the at least one current signal being dependent on a phase difference between the input and output signals;

generating a control signal depending on the at least one current signal, the control signal controlling the output signal.

16. A method as claimed in claim 15, further comprising generating a window signal and applying the window signal to a gate of a transistor serially coupled to the transistor receiving the input signal.

17. A method as claimed in claim 16 wherein the window signal is generated from the output signal.

18. A method as claimed in claim 15, further comprising supplying the at least one current signal to an output capacitor to generate the control signal.

* * * * *